(12) United States Patent
Nguyen et al.

(10) Patent No.: US 12,133,349 B2
(45) Date of Patent: Oct. 29, 2024

(54) INTELLIGENT CABLE TOPOLOGY DETECTION

(71) Applicant: Hewlett Packard Enterprise Development LP, Houston, TX (US)

(72) Inventors: Vincent Nguyen, Houston, TX (US); Minh H. Nguyen, Katy, TX (US); Kuan-Wei Chen, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 136 days.

(21) Appl. No.: 17/889,198

(22) Filed: Aug. 16, 2022

(65) Prior Publication Data

US 2024/0064919 A1 Feb. 22, 2024

(51) Int. Cl.
| | |
|---|---|
| *H05K 7/14* | (2006.01) |
| *G01R 31/3185* | (2006.01) |
| *G06F 1/18* | (2006.01) |
| *G06F 9/4401* | (2018.01) |
| *G06F 13/40* | (2006.01) |
| *H05K 1/02* | (2006.01) |
| *H05K 1/11* | (2006.01) |
| *H05K 5/02* | (2006.01) |
| *H05K 5/04* | (2006.01) |

(52) U.S. Cl.
CPC .............................. *H05K 7/1427* (2013.01)

(58) Field of Classification Search
CPC .............................. G06F 13/409; H05K 1/141
See application file for complete search history.

(56) References Cited

U.S. PATENT DOCUMENTS

| | | | |
|---|---|---|---|
| 2005/0091440 A1* | 4/2005 | Isa | G06F 13/409 711/1 |
| 2009/0080163 A1* | 3/2009 | Lyons | H05K 1/141 361/721 |
| 2015/0003226 A1* | 1/2015 | Bernard | H04W 24/08 370/210 |
| 2019/0104637 A1* | 4/2019 | Jochim | H05K 7/1494 |
| 2019/0319379 A1* | 10/2019 | Lin | H01R 13/6658 |
| 2022/0230936 A1* | 7/2022 | Zhong | H01L 25/0652 |

* cited by examiner

*Primary Examiner* — Getente A Yimer
(74) *Attorney, Agent, or Firm* — Yao Legal Services, Inc.

(57) ABSTRACT

One aspect of the instant application describes a system that includes a plurality of stacked mezzanine boards communicatively coupled to a motherboard and a metal enclosure enclosing the motherboard and mezzanine boards. A respective mezzanine board can include a number of solder pads, and the metal enclosure can include a plurality of metal strips, a respective metal strip to make contact with a solder pad of a corresponding mezzanine board. The system can further include a logic module positioned on the respective mezzanine board to determine a location of the respective mezzanine board based on a contact pattern between the metal strips and solder pads of the respective mezzanine board.

19 Claims, 9 Drawing Sheets

INTELLIGENT CABLE TOPOLOGY DETECTION

BACKGROUND

This disclosure is generally related to a multi-processor server with multiple mezzanine boards. More specifically, this disclosure is related to automated detection of the connection topology of the mezzanine boards.

BRIEF DESCRIPTION OF THE FIGURES

In the figures, like reference numerals refer to the same figure elements.

DETAILED DESCRIPTION

The following description is presented to enable any person skilled in the art to make and use the examples and is provided in the context of a particular application and its requirements. Various modifications to the disclosed examples will be readily apparent to those skilled in the art, and the general principles defined herein may be applied to other examples and applications without departing from the spirit and scope of the present disclosure. Thus, the scope of the present disclosure is not limited to the examples shown but is to be accorded the widest scope consistent with the principles and features disclosed herein.

The increased demand for high-performance servers in a data center may require a server to include multiple processors that work together to complete computational tasks. A multi-processor server may also be referred to as a multi-socket server, as each processor can have its own socket. As the number of processors/sockets increases in a server, they can no longer fit into a single printed circuit board (PCB). Mezzanine boards can be needed to accommodate multiple processors/sockets. When there are more than four sockets in a server, multiple (e.g., two or three) mezzanine boards can be used to accommodate those sockets. Moreover, to fit into the server enclosure (e.g., a 1U or 2U chassis), the mezzanine boards can be stacked vertically, with one above another.

The interconnections among processors on different mezzanine boards are often realized via cables because cascading mezzanine boards through direct mated connectors together are prohibited due to connector size limitation and signal integrity challenge. It is desirable to have a mechanism to validate cable connections among the mezzanine boards (i.e., which cable is connected to which board) during the manufacture testing or in-field upgrading process. Otherwise, the system may have invalid topology that can cause interoperability issues. Existing approaches for solving this problem rely on cables and boards with different connector types to prevent misconnections among the boards. After cable installation, the system BIOS (basis input/output system) can use the coherence bus (i.e., the cables) as an in-band detection mechanism during the power-on self-testing (POST) process to validate the topology. For example, one board can be equipped with one type of connector, and a different board can be equipped with a different type of connector. Only a cable with such two different types of connectors can connect these two boards. By specifying the connector type on each board and by providing special cables with the specific types of connectors, misconnections among the boards can be prevented. When installers test or upgrade servers, they would not mistakenly connect two boards that are not supposed to be connected, because the mismatched connector types would prevent such an operation. However, there are drawbacks in these approaches, because the different types of boards and cables may add complexity and cost in the supply chain for manufacturing the servers. It is desirable to use identical printed circuit board assemblies (PCBAs) to fabricate processor mezzanine boards in the servers and use identical cables for interconnections among the boards to reduce the non-recurring engineering (NRE) cost and the stock keeping units (SKUs) of the cables and PCBAs.

This disclosure describes a solution for automatic detection of the positioning order of multiple stacked mezzanine boards within a server. Each mezzanine board can include multiple (e.g., two or more) solder pads near the front edge. The metal chassis enclosing the mezzanine boards and motherboard can include a number of metal strips attached to the chassis sidewalls. Each metal strip can be in contact with a corresponding solder pad on a mezzanine board, thus grounding the corresponding solder pad. In addition, each solder pad can be coupled to a particular pin of a complex programmable logic device (CPLD) on the mezzanine board. Consequently, grounding the solder pad can pull down the voltage level of that particular pin. By arranging the metal strips in a special pattern such that each mezzanine board can have a unique combination of grounded and ungrounded solder pads, the stacking order of the mezzanine boards can be automatically detected.

According to some aspects, a multi-socket or multi-processor server can have multiple mezzanine boards, with each mezzanine board comprising one or more sockets. The mezzanine boards have the same type of cable connectors and the same firmware packages, which can facilitate interconnections among the mezzanine boards.

Figure 1:
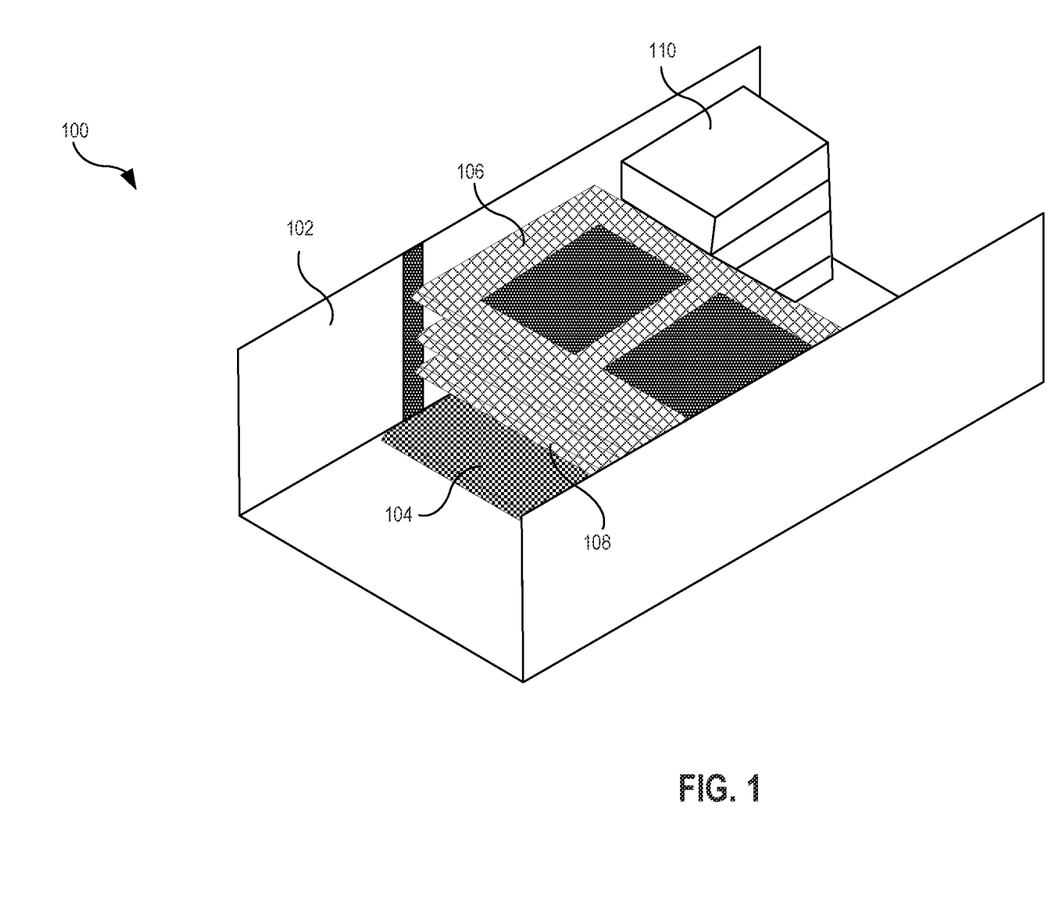
FIG. 1 illustrates an exemplary multi-socket server, according to one aspect.

FIG. 1 illustrates an exemplary multi-socket server, according to one aspect. Multi-socket server 100 can include a chassis 102, a motherboard 104, and a number of mezzanine boards (e.g., boards 106 and 108) coupled to each other and to motherboard 104. Multi-socket server 100 can also include other components (e.g., component 110). These other components can include a power supply, cooling fans, etc. Each mezzanine board can include the same type of cable connectors, thus making it possible for any mezzanine board to connect to any other mezzanine board. More specifically, during installation, the installer may randomly connect the mezzanine boards to each other without considering a specific connection order. For example, the cable connection order can be top-down, bottom-up, or random. This allows for simple installation but may result in an invalid processor topology. Moreover, during testing or upgrading, if a mezzanine board needs replacement, one needs to know which board in the server chassis should be replaced. Therefore, it is desirable to detect the connection order and topology among the mezzanine boards and motherboard after installation (i.e., after connecting the cables) such that the firmware on each mezzanine board can be configured correctly, and, in the event of one mezzanine board needing replacement, the motherboard can notify the user which mezzanine board (e.g., the top, middle, or bottom one in the example shown in FIG. 1) needs to be replaced. Although it is possible for the installer to connect the cables according to a deterministic order and topology (e.g., a top-down or bottom-up topology) such that the cable connection order would be deterministic to the motherboard, such requirement may make the installation process cumbersome and increase installation time and cost. It is preferred to have an automated way to detect the connection topology of mezzanine boards, even when the mezzanine boards are connected in a random order.

To facilitate automatic detection of the connection order and topology of multiple mezzanine boards and the motherboard, the server chassis and each mezzanine board can be modified. More specifically, each mezzanine board can include multiple predefined solder pads (which may be collectively referred to as a topology-detection-solder-pad array), and the chassis (which typically comprises a metal enclosure) can include multiple metal strips placed in predefined locations to ground the solder pads when in contact. The location of the metal strips can be designed such that topology-detection-solder-pad arrays on mezzanine boards at different locations (e.g., the top, middle, or bottom location in FIG. 1) can have different ground patterns. The ground pattern of the topology-detection-solder-pad array can be detected by a logic unit (e.g., a CPLD or a field-programmable gate array (FPGA)) on the mezzanine board, which can in turn send signals to a corresponding logic unit on the motherboard to allow the motherboard to determine the cable-connection topology indicating the interconnection among the mezzanine boards as well as the interconnection between the mezzanine boards and the motherboard.

Figure 2:
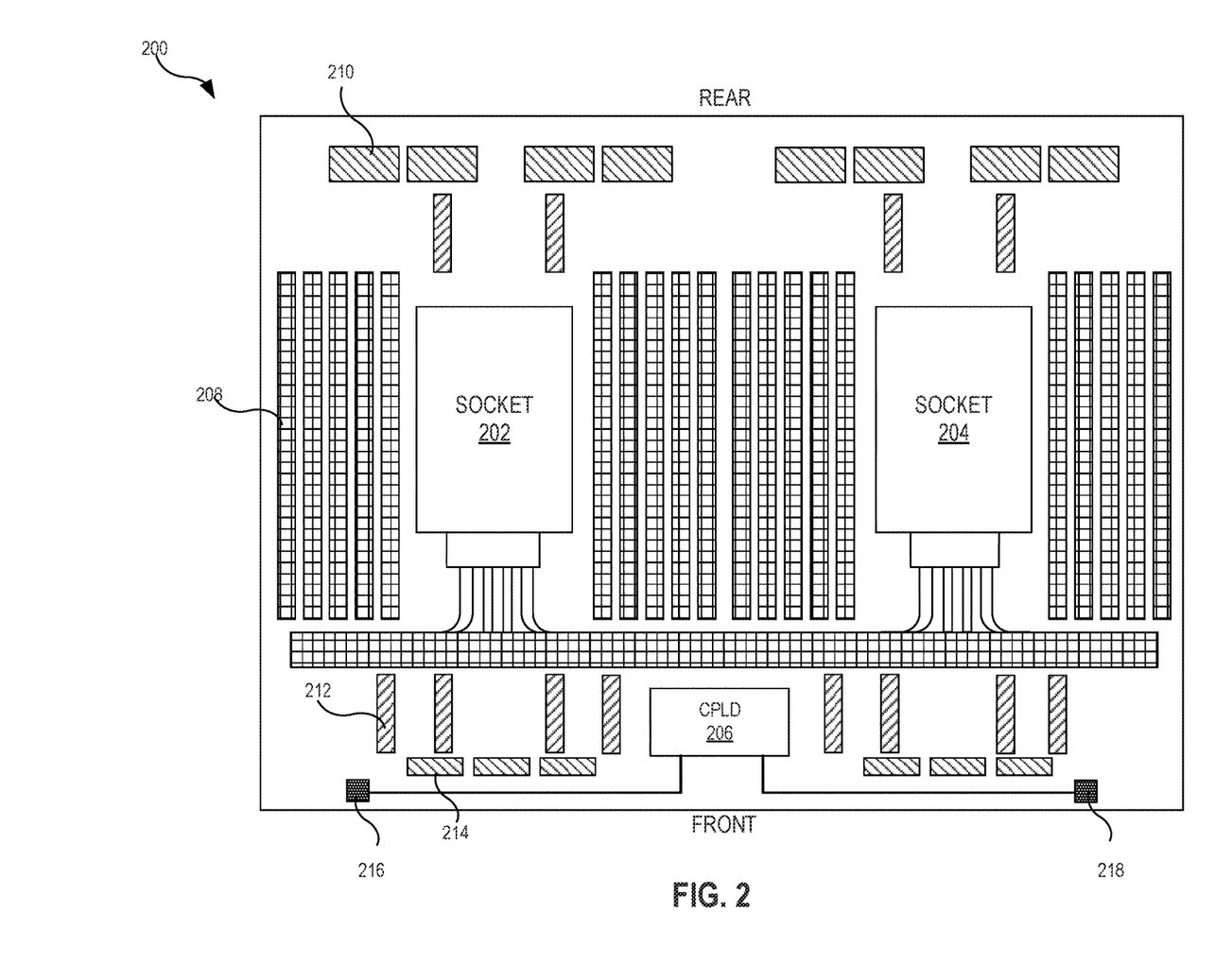
FIG. 2 illustrates an exemplary mezzanine board used in a multi-socket server, according to one aspect.

FIG. 2 illustrates an exemplary mezzanine board used in a multi-socket server, according to one aspect. Mezzanine board 200 can include a number of components, such as sockets 202 and 204, a complex programmable logic device (CPLD) 206, a number of memory slots (e.g., memory slot 208), a number of external input/output (I/O) ports (e.g., external I/O port 210), a number of internal I/O ports (e.g., internal I/O port 212), and a number of storage ports (e.g., storage port 214). Note that the external I/O ports allow mezzanine board 200 to connect to external peripheral devices, and the internal I/O ports allow mezzanine board 200 to connect to the motherboard and other mezzanine boards.

In addition to these components, mezzanine board 200 can include a number of solder pads that can be used for the automated detection of the cable-connection topology. These solder pads (e.g., solder pads 216 and 218) can form a topology-detection-solder-pad array that can facilitate the automated detection of the connection-topology of the mezzanine boards. In the example shown in FIG. 2, solder pads 216 and 218 are positioned near or adjacent to the front edge of mezzanine board 200. Note that the front edge of mezzanine board 200 refers to the edge that faces the front (or the user-facing) side of the server chassis. Moreover, FIG. 2 also shows that solder pads 216 and 218 are positioned near the left and right edges, when viewed from the front side of the board, respectively. This arrangement can allow easy accesses to these solder pads by metal strips attached to the sidewalls of the server chassis. Solder pads 216 and 218 are both coupled (e.g., via metal traces or transmission lines) to CPLD 206. According to some aspects, solder pads 216 and 218 can each be coupled to a pin of CPLD 206, such that when a solder pad is grounded, the voltage level of the corresponding pin can be pulled down from its default high level to the ground level. A particular solder pad can be grounded by a metal strip attached to the server chassis, which comprises metal and is typically grounded. A plurality of metal strips attached to the server chassis can be arranged according to a predetermined pattern, such that, depending on the location of the mezzanine board (e.g., the top, middle, or bottom location shown in FIG. 1), solder pads 216 and 218 can have a predetermined, unique ground pattern. For example, both solder pads can be grounded or ungrounded, or one of the solder pads can be grounded while the other one is ungrounded. In one example, the top mezzanine board in the server chassis can have its left solder pad (e.g., solder pad 216) ungrounded and its right solder pad (e.g., solder pad 218) grounded; the middle mezzanine board in the server chassis can have its left solder pad (e.g., solder pad 216) grounded and its right solder pad (e.g., solder pad 218) ungrounded; and the bottom mezzanine board in the server chassis can have both solder pads (e.g., solder pads 216 and 218)) grounded. If the ground status of a solder pad can be represented using a single bit (e.g., with bit value "1" indicating the ungrounded status and bit value "0" indicating the grounded status). Consequently, the ground patterns of solder pads on the top, middle, and bottom mezzanine boards can be represented as "10," "01," and "00," respectively. These ground patterns can then be used to identify the locations of the mezzanine boards. In other words, the use of two solder pads can form a two-bit identifier which can be used by the system to determine four distinctive locations. Note that, in the above example, bit pattern "11" is not used. A greater number of solder pads can expand the range of this identifier and accommodate more distinctive locations of the mezzanine boards. CPLD 206 can detect the ground pattern in order to determine the location of mezzanine board 200.

Figure 3:
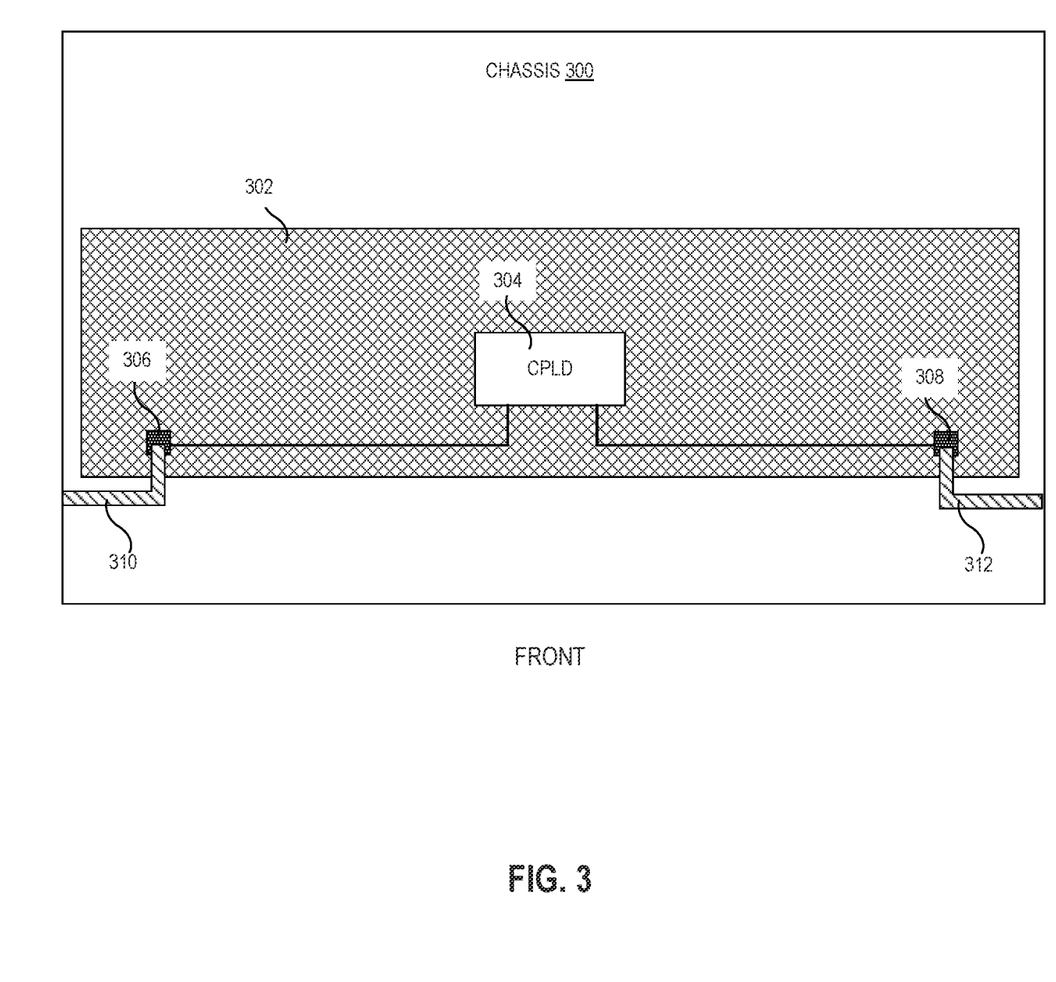
FIG. 3 illustrates exemplary electrical connections between the solder pads on a processor mezzanine board and the server chassis, according to one aspect.

Because the server's chassis is typically grounded for safety, the grounding of a solder pad can be achieved by establishing a direct electrical connection or path between the solder pad and the chassis. FIG. 3 illustrates exemplary electrical connections between the solder pads on a processor mezzanine board and the server chassis, according to one aspect. For simplicity of illustration, FIG. 3 only shows a partial view of the chassis and the mezzanine board, and not all components within the server chassis or on the mezzanine board are shown. In FIG. 3, chassis 300 encompasses a processor mezzanine board 302, which can include a CPLD 304 and solder pads 306 and 308 electrically coupled to CPLD 304. Two metal strips (or fingers) 310 and 312 are attached to opposite sidewalls of chassis 300 and are in direct contact with solder pads 306 and 308, respectively. Because metal strips 310 and 312 are electrically conductive with low resistivity, an electrically conductive path can be established between each solder pad and the server chassis, causing solder pads 306 and 308 to be grounded. Grounded solder pads 306 and 308 can in turn pull down the voltage level of corresponding pins on CPLD 304, such that CPLD 304 can detect the presence of metal strips 306 and 308 by detecting the voltage level of its corresponding pins.

Figure 4A:
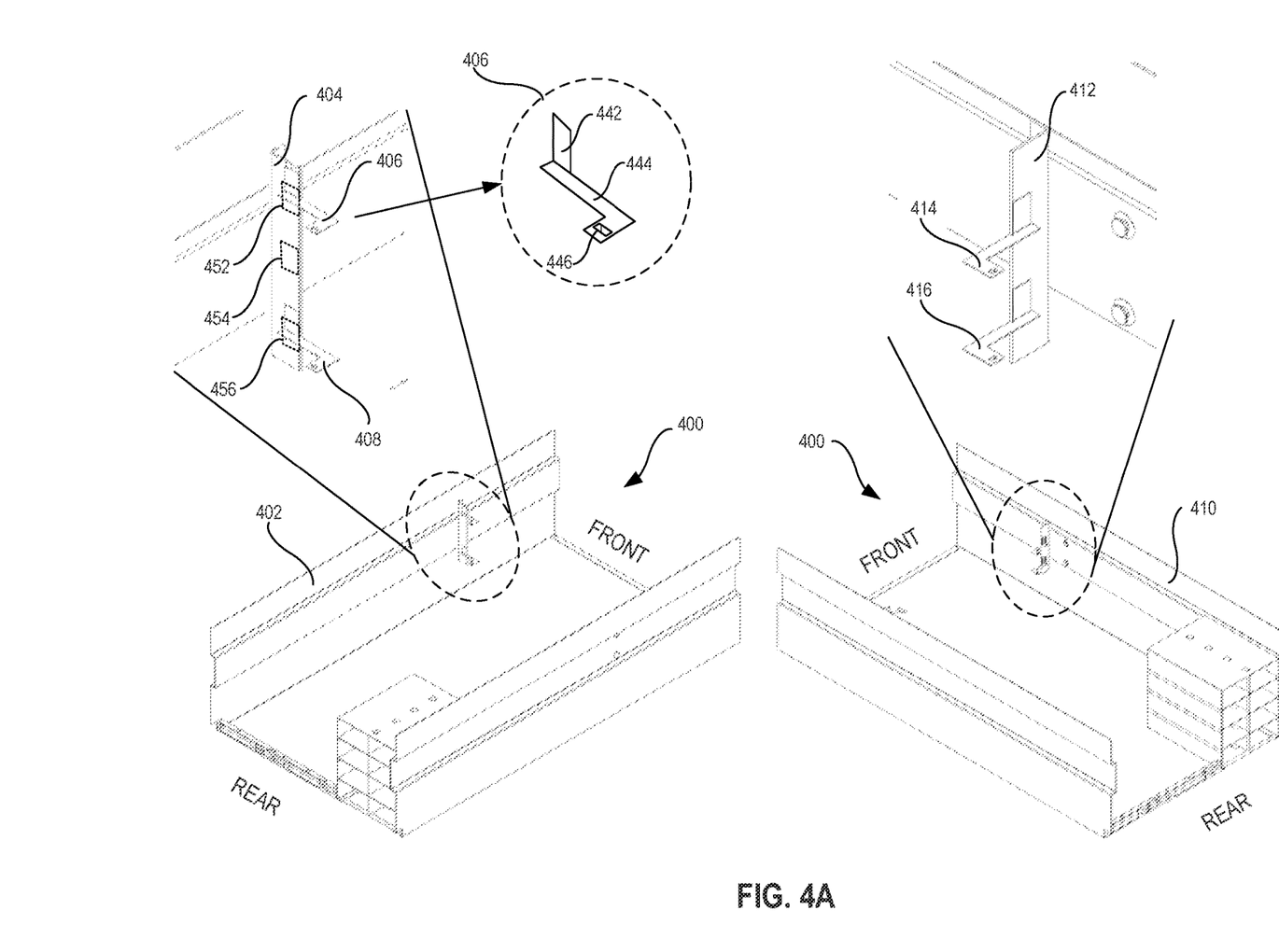
FIG. 4A illustrates an exemplary arrangement of multiple metal strips attached to a server chassis without showing the mezzanine boards, according to one aspect.

FIG. 4A illustrates an exemplary arrangement of multiple metal strips attached to a server chassis without showing the mezzanine boards, according to one aspect. In this example, server chassis 400 can hold three vertically stacked mezzanine boards. The left side of FIG. 4A shows the isometrical rear view of chassis 400 showing one sidewall of chassis 400, whereas the right side shows the isometrical rear view of chassis 400 showing the other sidewall.

The left side of FIG. 4A shows that a support bracket 404 is attached to a sidewall 402 of chassis 400. When viewed from the front side of chassis 400, sidewall 402 is on the righthand side. Support bracket 404 can be an L-shaped metal piece with two connected segments. One segment can be mounted on sidewall 402, and the other segment extends toward the internal space of chassis 400. In the example shown in FIG. 4A, two metal strips 406 and 408 are attached to support bracket 404. Each metal strip can include an attachment base for attaching the metal strip to support bracket 404 and an L-shaped contact-finger for making contact with a solder pad on the processor mezzanine board (e.g., solder pad 216 shown in FIG. 2). For example, metal strip 406 can include an attachment base 442 and an L-shaped contact-finger 444. According to one aspect, metal strip 406 can have a unibody construction. Alternatively, attachment base 442 and L-shaped contact-finger 444 can be welded together. Attachment base 442 can be attached to support bracket 404 using a suitable attaching mechanism, e.g., using a screw or being welded. L-shaped contact-finger 444 can extend toward the processor mezzanine board (e.g., mezzanine board 200 shown in FIG. 2) to contact a solder pad on the board. Metal strip 406 can be arranged in such a way that, when a corresponding mezzanine board is installed in chassis 400, L-shaped contact-finger 444 can press against the surface of the mezzanine board. This can be done by aligning L-shaped contact-finger 444 with the surface of the mezzanine board. The elongated shape of contact-finger 444 can allow contact-finger 444 to move vertically within a certain range when the mezzanine board is pushed into chassis 410, under metal strip 406, during installation. According to one aspect, L-shaped contact-finger 444 can also include an indentation 446 that can ensure a good contact between metal strip 406 and the solder pad on the mezzanine board. According to some aspects, each solder pad on the mezzanine board can have a corresponding indentation to receive indentation 446 to allow metal strip 406 to snap into place.

In the example shown in FIG. 4A, each support bracket can include three segments (i.e., top segment 452, middle segment 454, and bottom segment 456 of support bracket 404), onto which the metal strips can be attached. The location of each segment corresponds to the location of a mezzanine board within chassis 400. For example, top segment 452 corresponds to a top mezzanine board, middle segment 454 corresponds to a middle mezzanine board, and bottom segment 456 corresponds to a bottom mezzanine board. The mother board, on the other hand, is typically positioned below the bottom mezzanine board. In the left drawing of FIG. 4A, metal strips 406 and 408 are attached to top and bottom segments 452 and 456, respectively, of support bracket 404. This means that metal strips 406 and 408 will be in contact with solder pads on the top and bottom mezzanine boards, respectively.

The right side of FIG. 4A shows that a support bracket 412 is attached to a sidewall 410 of chassis 400. When viewed from the front side of chassis 400, sidewall 410 is on the lefthand side. The right side shows metal strips 414 and 416 being attached to support bracket 412. More specifically, metal strips 414 and 416 can be attached to the middle and bottom segments, respectively, of support bracket 412. Accordingly, metal strips 414 and 416 can be in contact with solder pads on the middle and bottom mezzanine boards, respectively.

Figure 4B:
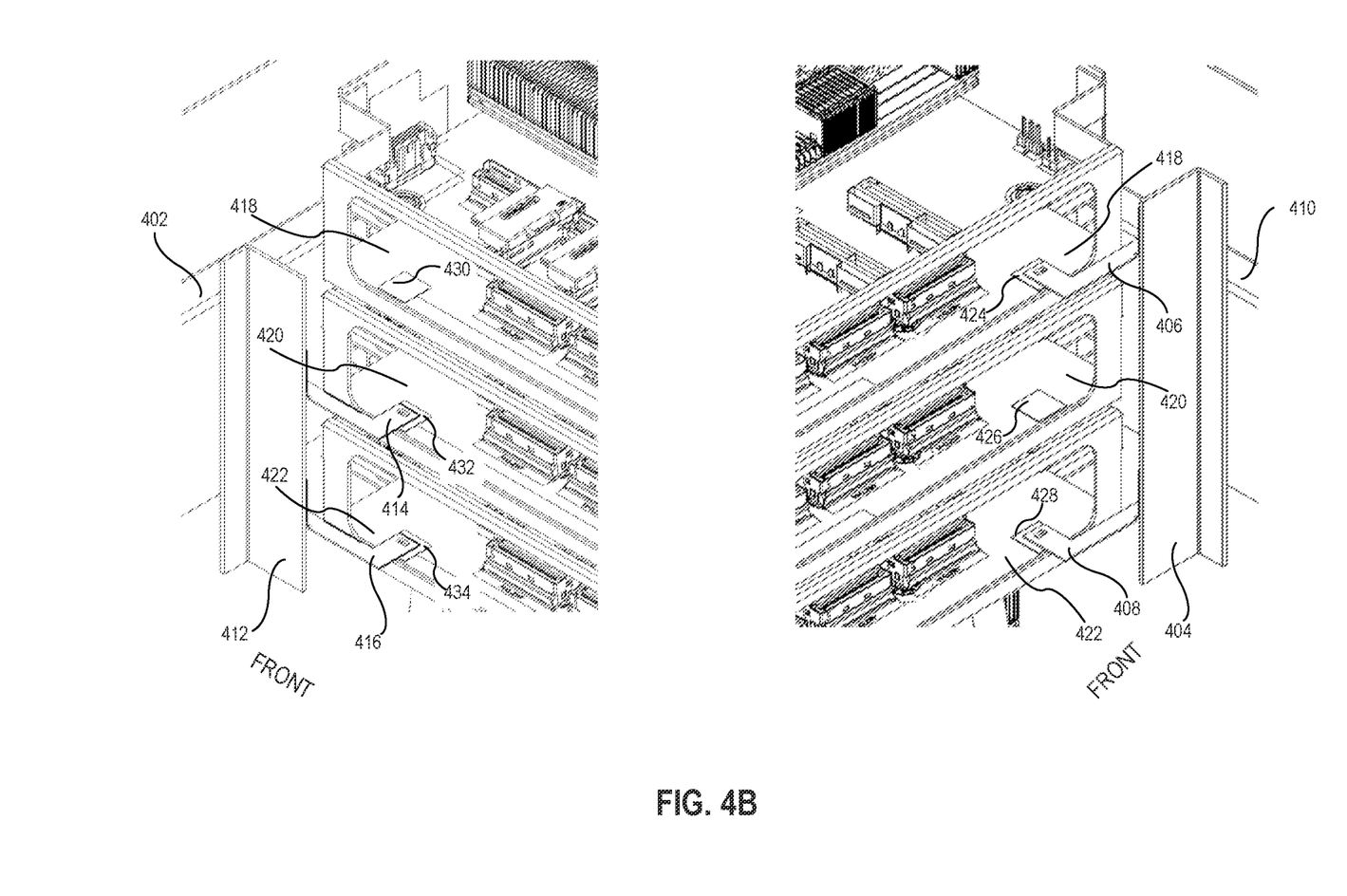
FIG. 4B illustrates exemplary coupling between the metal contact-fingers and the solder pads on the mezzanine boards, according to one aspect.

FIG. 4B illustrates exemplary coupling between the metal contact-fingers and the solder pads on the mezzanine boards, according to one aspect. In FIG. 4B, the server chassis is viewed from the front side. The right side of FIG. 4B corresponds to the left side of FIG. 4A, and the left side of FIG. 4B corresponds to the right side of FIG. 4A. FIG. 4B shows a portion of a server chassis that includes mezzanine boards 418, 420, and 422 stacked on top of one another. More specifically, mezzanine board 418 is positioned at the top, mezzanine board 420 is positioned in the middle, and mezzanine board 422 is positioned at the bottom of the server chassis (e.g., server chassis 400 shown in FIG. 4A). Note that the motherboard included in the server chassis is not shown in FIG. 4B and is typically positioned below bottom mezzanine board 422.

The right side of FIG. 4B shows support bracket 404 being coupled to chassis sidewall 410. Metal strips 406 and 408 are attached to the top and bottom segments, respectively, of support bracket 404. FIG. 4B also shows that the mounting locations of support bracket 404 and metal strips 406 and 408 can be selected such that the L-shaped contact-fingers of metal strips 406 and 408 are substantially aligned with the top surface of top and bottom mezzanine boards 418 and 422, respectively. More specifically, the contact-finger of metal strip 406 is in direct contact with solder pad 424 on top mezzanine board 418, and the contact-finger of metal strip 408 is in direct contact with solder pad 428 on bottom mezzanine board 422. On the other hand, solder pad 426 on middle mezzanine board 420 is not in contact with any contact-finger. As a result, solder pads 424 and 428 are grounded, whereas solder pad 426 remains ungrounded.

The left side of FIG. 4B shows support bracket 412 coupled to chassis sidewall 402. Metal strips 414 and 416 are attached to the middle and bottom segments, respectively, of support bracket 412. Support bracket 412 and metal strips 414 and 416 are located in such a way as to ensure that the L-shaped contact-fingers of metal strips 414 and 416 are substantially aligned with the top surface of middle and bottom mezzanine boards 420 and 422, respectively. More specifically, the contact-finger of metal strip 414 is in direct contact with solder pad 432 on middle mezzanine board 420, and the contact-finger of metal strip 416 is in direct contact with solder pad 434 on bottom mezzanine board 422. On the other hand, solder pad 430 of top mezzanine board 418 is not in contact with any contact-finger. As a result, solder pads 432 and 434 are grounded, whereas solder pad 430 remains ungrounded.

As can be seen by combining the left and right sides of FIG. 4B and with the reference to the corresponding right and left sides of FIG. 4A, metal strips 414 and 416 are attached to the middle and bottom segments, respectively, of support bracket 412, and metal strips 406 and 408 are attached to top and bottom segments 452 and 456, respectively, of support bracket 404. Consequently, top mezzanine board 418 has its left solder pad 430 ungrounded and right solder pad 424 grounded, middle mezzanine board 420 has its left solder pad 432 grounded and right solder pad 426 ungrounded, and bottom mezzanine board 422 has both left and right solder pads 434 and 428 grounded. As discussed previously, these solder pads can be coupled to a CPLD (e.g., CPLD 206 shown in FIG. 2) on each mezzanine board. Each pair of solder pads (e.g., solder pads 430 and 424, solder pads 432 and 426, and solder pads 434 and 428) can be coupled to a pair of dedicated CPLD pins of each respective mezzanine board (e.g., mezzanine board 418, mezzanine board 420, and mezzanine board 422). Each CPLD pin may have a default high voltage value. When a solder pad is grounded, the voltage level on a connected CPLD pin is pulled down or decreased. If we denote the high-voltage status of a CPLD pin as "1" and the low-voltage status as "0," the status of the CPLD pins on top mezzanine board 418 can be represented as "10," with "1" corresponding to ungrounded solder pad 430 and "0" corresponding to grounded solder pad 424. Similarly, the status of the CPLD pins on middle mezzanine board 420 can be represented as "01," and the status of the CPLD pins on bottom mezzanine board 422 can be represented as "00." This way, the location of each mezzanine board can be uniquely encoded based on the voltage level of the CPLD pins. Therefore, by checking its pin status, each CPLD can determine its current location within the stack (e.g., top, middle, or bottom in the example shown in FIGS. 4A-4B). According to one aspect, each CPLD can also report its pin status to the motherboard (e.g., to a CPLD on the motherboard), thus notifying the motherboard of its current location. Note that, in the current example, there are a total of three mezzanine boards, and bit values "11" are not used.

In the example shown in FIGS. 4A-4B, each mezzanine board has two solder pads positioned near opposite sidewalls of the server chassis to allow two separate metal strips attached to those opposite sidewalls to make contact with the solder pads. In general, there can be different ways to arrange the solder pads and metals strips. For example, the solder pads can all be positioned near one sidewall of the chassis, and metal strips attached to the same side wall can be used to ground those solder pads.

Figure 5A:
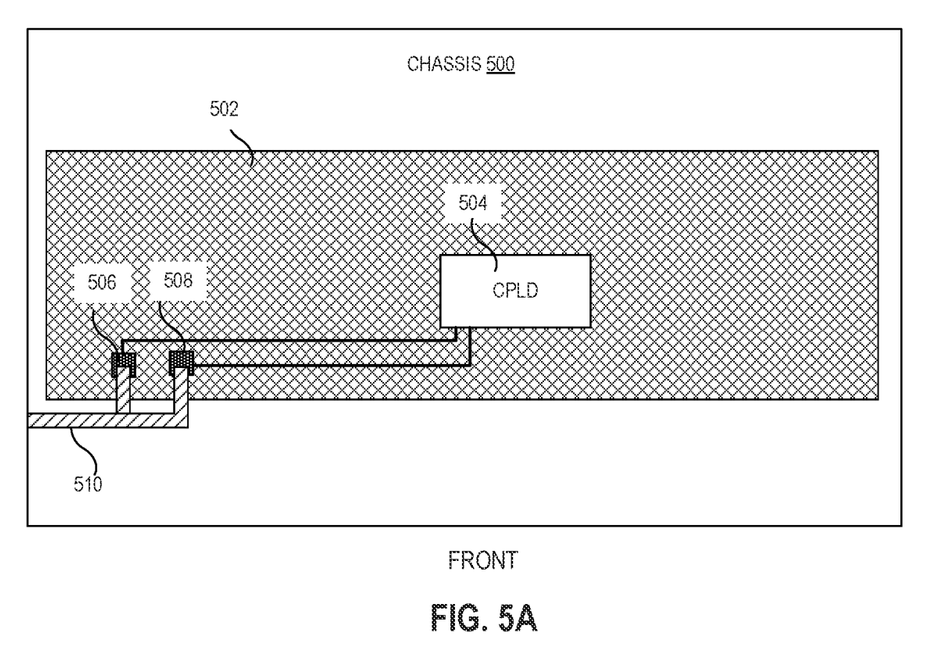
FIGS. 5A-5B illustrate an exemplary arrangement of the solder pads and metal strips, according to one aspect.
Figure 5B:
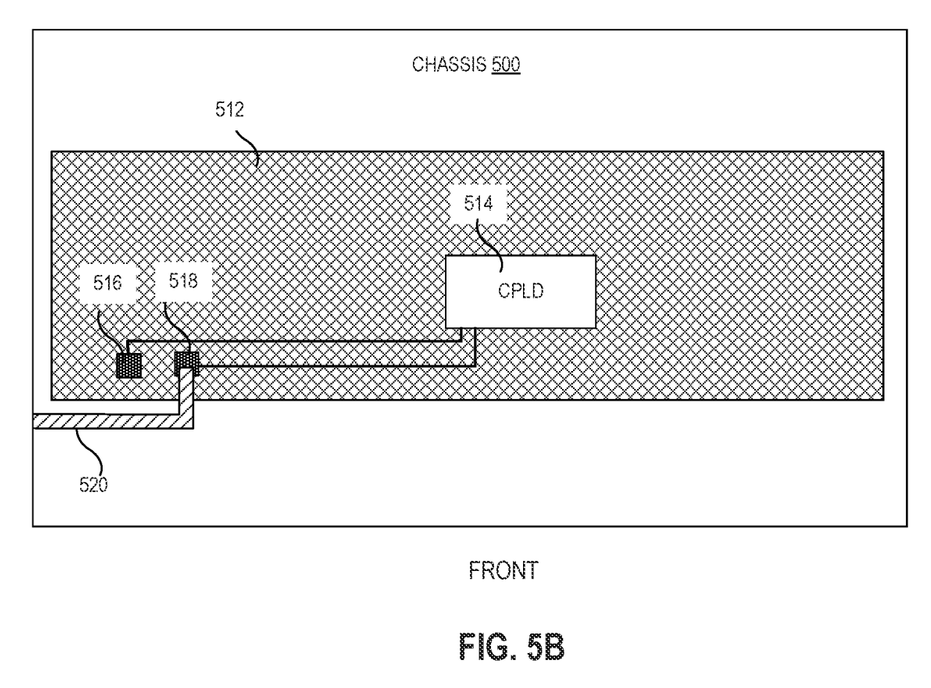

FIGS. 5A-5B illustrate an exemplary arrangement of the solder pads and metal strips, according to one aspect. FIG. 5A shows a mezzanine board 502 positioned inside a chassis 500. Mezzanine board 502 includes a CPLD 504 and solder pads 506 and 508 coupled to CPLD 504. Solder pads 506 and 508 can be positioned near the left sidewall of chassis 500. FIG. 5A also shows a metal strip 510 including two finger-contacts, and each finger-contact is in direct contact with a solder pad. In other words, solder pads 506 and 508 are both grounded by metal strip 510. On the other hand, FIG. 5B shows a mezzanine board 512 positioned inside chassis 500. Mezzanine board 512 can be identical to mezzanine board 502 and can include a CPLD 514 and solder pads 516 and 518 positioned near the left sidewall of chassis 500. FIG. 5B shows that a metal strip 520 includes only one finger-contact, and that the finger-contact is in direct contact with solder pad 518. Solder pad 516 is not coupled to any finger-contact. As a result, solder pad 518 is grounded by metal strip 520, whereas solder pad 516 remains ungrounded.

As can be seen from FIGS. 5A-5B, the ground pattern of the solder pads on each mezzanine board can be determined by the shape (or the number of contact-fingers) of the corresponding metal strip. Therefore, by arranging metal strips attached to the server chassis into a predetermined pattern, the ground pattern of the solder pads on the mezzanine board at each location (e.g., top, middle, or bottom location) can be predetermined. Consequently, the location of a mezzanine board can be determined based on the ground pattern.

Other variations can also be possible. For example, two solder pads (i.e., two bits) can be used to encode up to four different board locations. Increasing the number of solder pads (e.g., to three or four) can increase the number of possible board locations. For example, three solder pads can be used to encode eight board locations. On the other hand, when the number of mezzanine boards included in the server chassis decreases, the number of solder pads on each mezzanine board can decrease as well. For example, if there are only two mezzanine boards in the server chassis, then only one solder pad is needed on each board. Moreover, in addition to attaching the metal strips to sidewalls of the server chassis, it is also possible to attach the metal strips to other parts (e.g., the top or bottom cover) of the server chassis, as long as the positions of the metal strips can correspond to positions of the mezzanine boards to allow the metal strips to make contact with solder pads on the surface of the mezzanine boards. Note that the size and locations of the solder pads can depend on the board design. Each solder pad should be sufficiently large to allow for easy contact between the solder pad and contact-finger of a metal strip. The metal strips and the support brackets can be made of various metallic materials, including but not limited to: aluminum, steel, stainless steel, brass, copper, zinc, an alloy, and a combination thereof.

Once the CPLD on each mezzanine board detects the ground pattern of the solder pads, the CPLD can determine the location of the mezzanine board in the stack of mezzanine boards. Accordingly, the CPLD can set a socket number or identifier (ID) for each processor on the mezzanine board according to a predetermined numbering scheme. For example, it may be determined that the socket numbers are represented using binary bits and increment from the top of the stack to the bottom of the stack. In such a case, the two processors on the top mezzanine board can be assigned socket numbers 001 and 010, processors on the next mezzanine board in the stack can be assigned socket numbers 011 and 100, and so on. Other numbering schemes can also be used. For example, three bits can be used to number up to eight processors, and more bits will be needed if there are more processors. It is also possible that the socket number increments from bottom up, or the socket numbers can be out of sequence, as long as the mappings between the socket numbers and the mezzanine board locations are known. The determined socket numbers can be communicated, via cables, to the motherboard and other connected mezzanine boards. The CPLD can also assign a unique board number or ID for each mezzanine board location. For example, the top board can be numbered board 1, the next one board 2, and so on.

Figure 6:
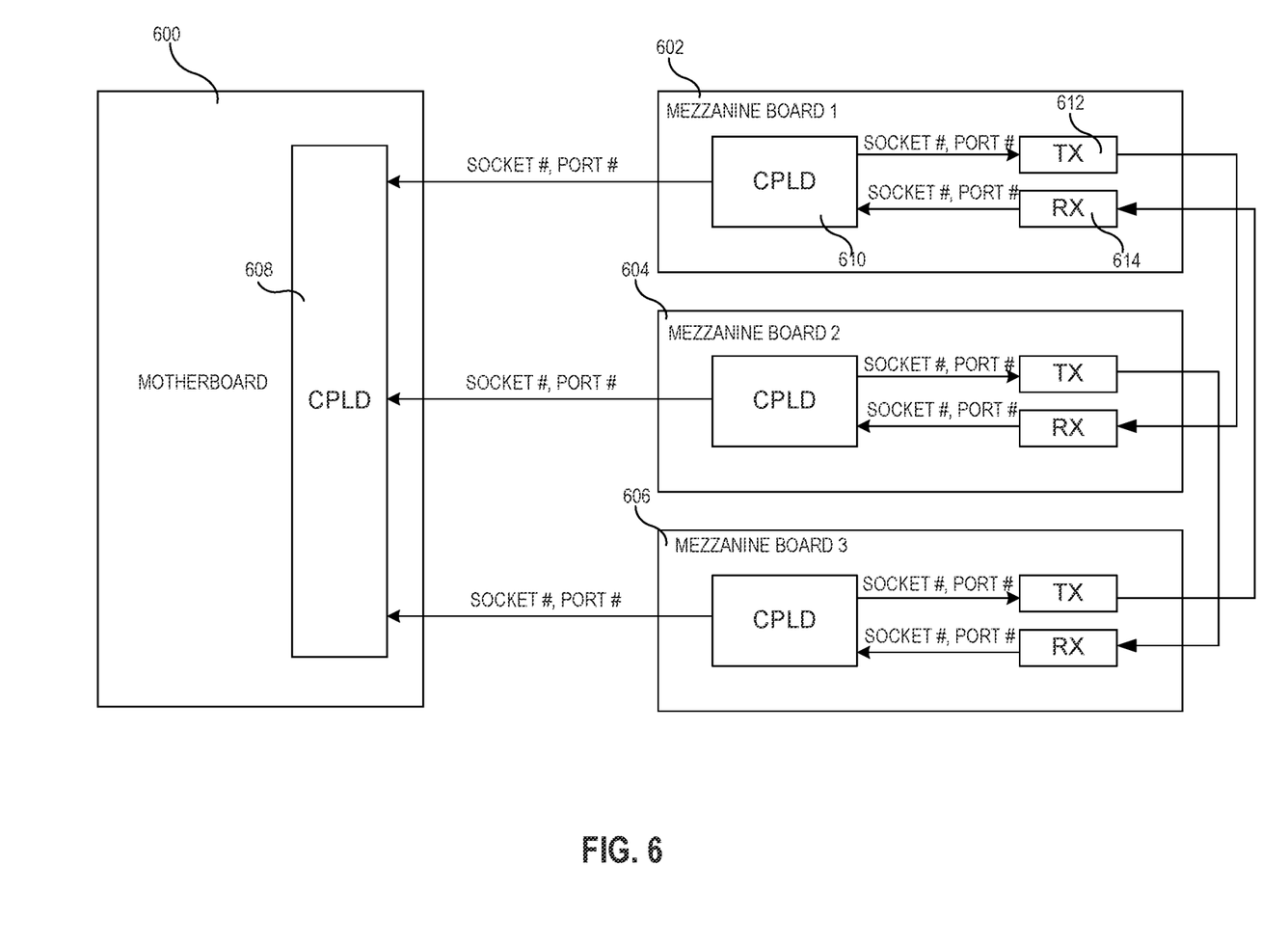
FIG. 6 illustrates exemplary communications among the mezzanine boards and the motherboard, according to one aspect.

FIG. 6 illustrates exemplary communications among the mezzanine boards and the motherboard, according to one aspect. In FIG. 6, a motherboard 600 is coupled to processor mezzanine boards 602, 604, and 606. Motherboard 600 can include a logic unit for performing a number of logic functions that can be used to detect an invalid topology or connection among the mezzanine boards. According to one aspect, the logic unit can be a CPLD, such as CPLD 608. Other types of programmable logics, such as FPGAs, can also be used. Each mezzanine board can also include a logic unit that can be used to detect the location of the mezzanine board and to set socket numbers for the processors. In addition, each mezzanine board can include an inter-board connector for communicating with other mezzanine boards. The connector can include a transmitter for sending signals and a receiver for receiving signals. For example, mezzanine board 602 can include a CPLD 610 (which may be the same as or similar to CPLD 206 shown in FIG. 2), a transmitter 612, and a receiver 614. The transmitter of one board can be coupled (e.g., using a cable) to the receiver of a different board. Note that the board transmitting information can be referred to as an upstream board, and the board receiving information can be referred to as a downstream board.

In the example shown in FIG. 6, transmitter 612 of board 602 is coupled to the receiver of board 604 (i.e., board 604 is downstream with respect to board 602), the transmitter of board 604 is coupled to the receiver of board 606 (i.e., board 606 is downstream with respect to board 604), and the transmitter of board 606 is coupled to the receiver of board 602 (i.e., board 602 is downstream with respect to board 606). After installation of the cables and after powering up the server, the CPLD of each mezzanine board can automatically detect the location of the board in the stack of boards and assign a socket number for each processor on the board. The CPLD can optionally set a board number. In addition to the socket numbers, the CPLD can also determine a port number for the connector. Note that the port number is fixed and depends on the connections between the connector and other components on the board. According to some aspects, the port number of a connector can include two bits.

The socket-and-port information (which can include the socket numbers for the processors and a port number for the connector on the corresponding mezzanine board) can be communicated by the CPLD on one mezzanine board to the CPLD of a connected, downstream mezzanine board. Moreover, the CPLD on the mezzanine board can also receive socket-and-port information from a connected, upstream mezzanine board. For example, CPLD 610 of mezzanine board 602 can send its own socket-and-port information to mezzanine board 604 via transmitter 612 and receive socket-and-port information from mezzanine board 606 via receiver 614. CPLD 610 can compare the received socket-and-port information with a predetermined topology to detect whether the connections are invalid. For example, a particular design may require that different mezzanine boards to be connected according to a certain order (e.g., mezzanine board 602 connected to mezzanine board 604, which is connected to mezzanine board 606, etc.). By comparing the socket-and-port information received from mezzanine board 606, CPLD 610 can determine whether the connection between mezzanine boards 602 and 606 is a valid connection.

In addition, the CPLD of each mezzanine board can send its own socket-and-port information and the socket-and-port information received from a connected upstream mezzanine board to CPLD 608 of motherboard 600. For example, CPLD 610 can send socket-and-port information associated with the local mezzanine board (i.e., board 602) and socket-and-port information associated with a remotely coupled mezzanine board (i.e., board 606) to CPLD 608 of motherboard 600. According to alternative aspects, the CPLD of each mezzanine board may send its own board ID and the ID of the remote board to CPLD 608, and CPLD 608 can assign socket numbers to processors on each board based on the corresponding board ID. Note that an exemplary board ID can include a manufacturer's serial number of a user-defined identifier. In one example, the board ID can be a two-bit identifier that indicates the location of the board in the stack, with "10," "01," and "00" indicating the top, middle, and bottom locations, respectively. Once CPLD 608 receives the socket-and-port information from all mezzanine boards, it can determine the connection topology of these mezzanine boards and their locations in the stack. For example, based on the socket-and-port information received from mezzanine board 602, CPLD 608 can determine that board 602 is located at the top of the stack and its receiver is coupled to the transmitter of board 606. Similarly, based on the socket-and-port information received from mezzanine boards 604 and 606, CPLD 608 can determine that board 604 is located in the middle of the stack and its receiver is coupled to the transmitter of board 602, and that board 606 is located at the bottom of the stack and its receiver is coupled to the transmitter of board 604. In addition to determining the inter-mezzanine-board cable connections, CPLD 608 of motherboard 600 can also determine the cable connections between each mezzanine board and motherboard 608 based on the socket-and-port information received from each mezzanine board. CPLD 608 can further determine whether the mezzanine board connection topology is invalid and log an error message for a detected invalid connection. According to some aspects, CPLD 608 can also send a notification to the system BIOS to stop the booting process and display the error message indicating the invalid connection.

Figure 7:
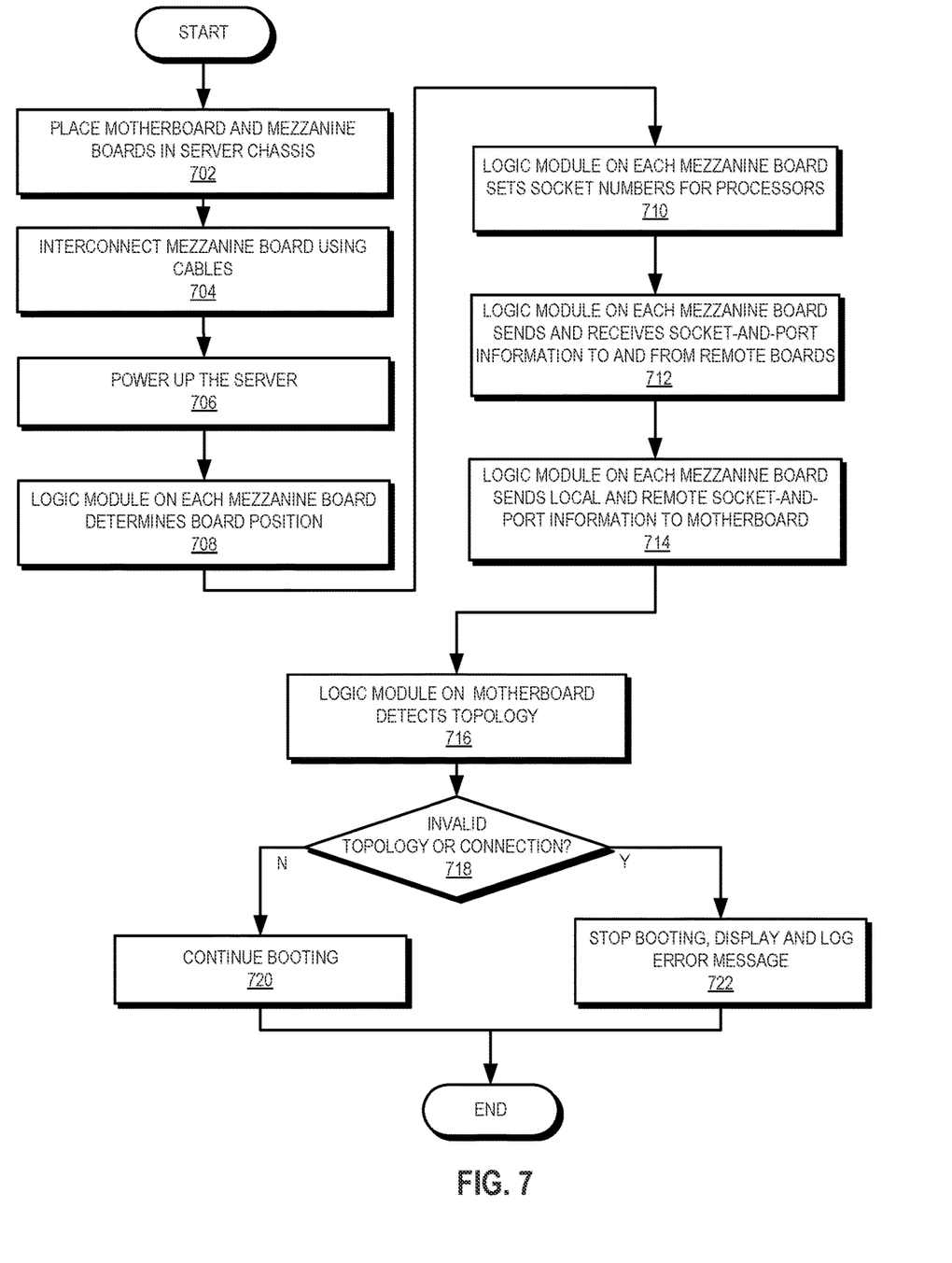
FIG. 7 presents a flowchart illustrating an exemplary process for detecting connection errors in a multi-socket server, according to one aspect.

FIG. 7 presents a flowchart illustrating an exemplary process for detecting connection errors in a multi-socket server, according to one aspect. During operation, the motherboard (e.g., mother board 104 shown in FIG. 1) and mezzanine boards (e.g., mezzanine boards 106 and 108 shown in FIG. 1) of the server are placed in a server chassis (e.g., server chassis 100 in FIG. 1) (operation 702). The server chassis can include a plurality of pre-installed metal strips/fingers (e.g., metal strips 406, 408, 414, and 416 shown in FIG. 4A) mechanically attached and electrically coupled to one or more sidewalls of the server chassis. The mounting locations of the metal strips/fingers have been arranged in such a way that each metal strip/finger can be in direct contact with a solder pad (e.g., solder pad 216 or 218 shown in FIG. 2) on a corresponding mezzanine board (e.g., mezzanine board 200 shown in FIG. 2), thus grounding the solder pad. The solder pad is electrically coupled to a pin on a logic module (e.g., CPLD 206 shown in FIG. 2) of the mezzanine board, and grounding the solder pad can cause the voltage level of the pin to be pulled down from a default high level. The metal strips can be arranged such that the contact pattern between the metal strips and solder pads on each mezzanine board can be unique. The mezzanine boards can then be interconnected using cables (operation 704). Note that the mezzanine boards can be identical in terms of having the same type of cable connectors and firmware packages.

Subsequent to the installation and connection of the motherboard and mezzanine boards, the server is powered up (operation 706). Once powered, the logic module (e.g., a CPLD or FPGA module) on each mezzanine board (e.g., CPLD 610 on mezzanine board 602 shown in FIG. 6) can determine the position of the mezzanine board within the stack (operation 708). More specifically, the logic module can detect the contact pattern between the metal strips and the solder pads and then determine the position of the board based on the detected contact pattern. The logic module can further set the socket numbers for the processors (e.g., sockets 202 and 204 shown in FIG. 2) on the same mezzanine board based on the determined board position and a predetermined numbering scheme (operation 710). The logic module can optionally assign a unique board identifier (ID) for the mezzanine board based on its position information, and the socket numbers or IDs of the processors can be computed based on the board ID according to a predetermined algorithm. According to some aspects, each mezzanine board can include two processors, and the socket number corresponding to each processor can be represented using a number of binary bits.

The logic module on each mezzanine board can send, via cables interconnecting the mezzanine boards, socket-and-port information of the local board to a remote downstream board and receive, from a remote upstream board, socket-and-port information of the remote board (operation 712). Note that the inter-board connector on each mezzanine board can have a transmitter for transmitting information to a downstream board and a receiver for receiving information from an upstream board. The logic module on each mezzanine board can also send its own socket-and-port information and the socket-and-port information from an upstream board to a logic module on the motherboard (e.g., CPLD 608 on motherboard 600 shown in FIG. 6) (operation 714).

The logic module (e.g., a CPLD or FPGA module) on the motherboard can then determine the connection topology of all mezzanine boards based on the socket-and-port information received from each mezzanine board (operation 716) and determine whether the topology is invalid or whether a connection between two boards is invalid (operation 718). Determining whether the topology is invalid can include comparing the detected topology with a predefined known topology. According to one aspect, the system can define and store a finite number of valid topologies. During booting, the detected topology can be compared with the known valid topologies. Validation effort can be saved by controlling the number of valid topologies. Validating the cable-connection topology of the mezzanine boards during system booting can ensure the system performance. If there is no invalid cable connection, the server continues the booting process (operation 720). If the topology is invalid or an invalid cable connection is detected, the system stops the booting process and displays and logs an error message to indicate the invalid connection (operation 722).

Figure 8:
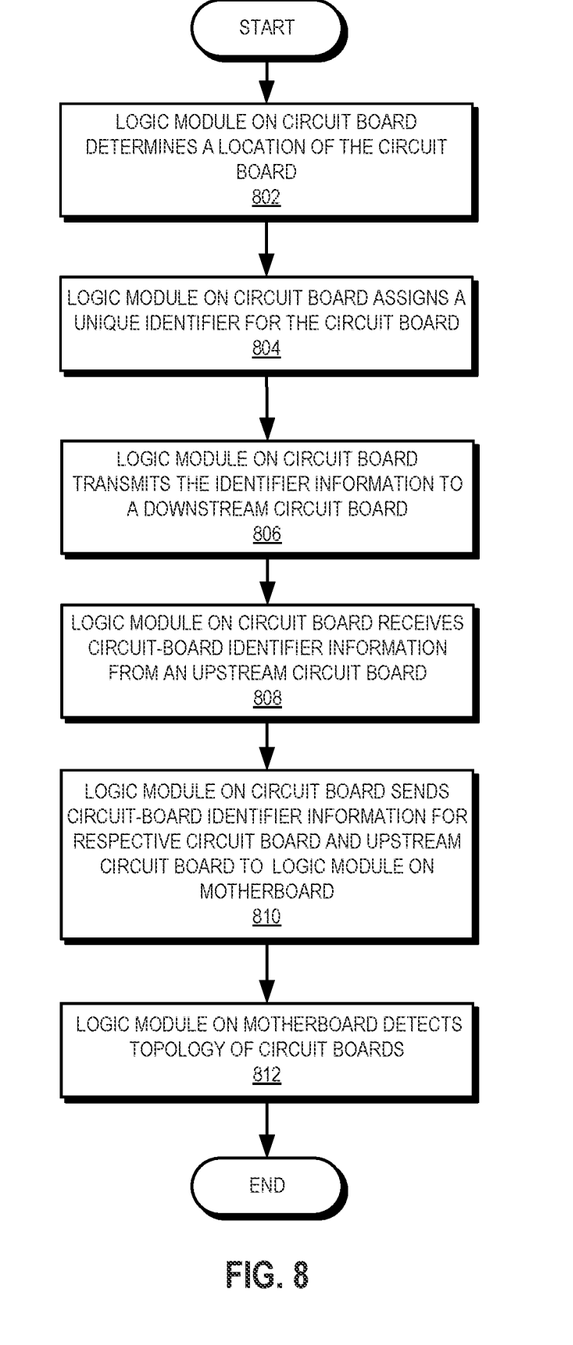
FIG. 8 presents a flowchart illustrating an exemplary process for detecting the topology of a plurality of interconnected and stacked circuit boards, according to one aspect.

FIG. 8 presents a flowchart illustrating an exemplary process for detecting the topology of a plurality of interconnected and stacked circuit boards, according to one aspect. During operation, a logic module on a respective circuit board (e.g., CPLD 610 on mezzanine board 602 shown in FIG. 6) can determine a location of the circuit board (operation 802). Note that the circuit board can include a number of solder pads (e.g., solder pads 216 and 218 shown in FIG. 2), and a solder pad can be grounded by a metal strip (e.g., metal strip 406 shown in FIG. 4A) attached to a metal enclosure (e.g., chassis 400 shown in FIG. 4A) enclosing the circuit boards. To determine the location of the circuit board, the logic module can determine the ground pattern of the solder pads on the circuit boards.

The logic module can then assign a unique identifier for the circuit board based on its determined location (operation 804). For example, the identifiers of the circuit boards can increment or decrement along the stacking direction (e.g., from top down or bottom up) of the circuit boards. The logic module can further transmit information associated with the unique identifier of the current circuit board to a downstream circuit board (operation 806) and receive, from an upstream circuit board, information associated with an identifier of the upstream circuit board (operation 808). The logic module on the circuit board can also send, to a logic module on a motherboard (e.g., CPLD 608 on motherboard 600 shown in FIG. 6) communicatively coupled to the plurality of circuit boards, information associated with the identifier of the respective circuit board and information associated with the identifier of the upstream circuit board (operation 810). The logic module on the motherboard can then detect the topology of the interconnected and stacked circuit boards (operation 812).

In general, this disclosure describes a multi-socket server with the capability of automatic detection of the cable-connection topology of multiple stacked mezzanine boards. To facilitate the automated detection of the position of each mezzanine board within the stack, each mezzanine board can include a topology-detection-solder-pad array comprising a number of solder pads, and the server chassis can include a number of metal strips attached to its sidewalls or frame. The positions of the solder pads and the metal strips can be arranged to allow each metal strip to be in direct contact with a solder pad, which results in the grounding of the solder pad. The distribution of the metal strips can be configured to ensure that the topology-detection-solder-pad array on each mezzanine board can have a unique ground pattern corresponding to the position of the board in the stack. Each mezzanine board can have a logic module (e.g., a CPLD device or an FPGA device) that can detect the ground pattern of the topology-detection-solder-pad array in order to detect the board position. The logic module on each board can further assign socket IDs for processors on the board and communicate such information to a connected downstream board. The logic module can then report the socket IDs of the local board and an upstream board to the motherboard to allow a logic module on the motherboard to determine the connection topology of all mezzanine boards in the server in order to detect whether there is an invalid cable connection. The automated detection of the cable-connection topology can occur during the server booting process, and the booting process can be stopped when an invalid cable connection is detected.

Compared with existing solutions that require different types of cable connectors on each mezzanine board, the described solution allows all mezzanine boards to be fabricated based on a common PCBA design. The mezzanine boards can be identical in terms of cable connectors and firmware packages, which can lower the NRE cost. Moreover, the described solution does not rely on particular types of cables or PCBAs with particular types of cable connectors, thus providing flexibility in the selection of cables or PCBAs. Consequently, it can reduce the SKUs of cables and PCBAs to reduce inventory cost. Additional benefits can include reducing the validation effort by controlling the number of valid topologies and simplifying debugging and examination during manufacturing or servicing of the device by providing complete and detailed cable connectivity information regarding the mezzanine boards.

In the disclosed examples, there are three mezzanine boards, and each board includes two processors. The server can include more or fewer than three mezzanine boards, and the number of processors on each board can be more or fewer than two. The number of bits used to represent the socket numbers can vary depending on the total number of processors in the server. In the disclosed examples, the solder pads are shown to be close to the front edge of each board to allow for easy contact by the metal strips from the front side. Other configurations are also possible depending on the space constraints in the server chassis and the layout of each mezzanine board. For example, it is also possible to arrange the solder pads near the rear edge of each mezzanine board or align them along a side edge.

One aspect of the instant application describes a system that includes a plurality of stacked mezzanine boards, each mezzanine board being communicatively coupled to a motherboard and a metal enclosure enclosing the motherboard and mezzanine boards. A respective mezzanine board can include a number of solder pads, and the metal enclosure can include a plurality of metal strips, a respective metal strip to make contact with a solder pad of a corresponding mezzanine board. The system can further include a logic module positioned on the respective mezzanine board to determine a location of the respective mezzanine board based on a contact pattern between the metal strips and solder pads of the respective mezzanine board.

In a variation on this aspect, the solder pads on the respective mezzanine board can be electrically coupled to corresponding pins of the logic module.

In a variation on this aspect, the metal enclosure is grounded, and the respective metal strip can be attached to a sidewall of the metal enclosure, thereby grounding the solder pad in contact with the respective metal strip.

In a further variation, the respective metal strip can include an attachment base attached to the sidewall via a support bracket and an L-shaped contact-finger to be in contact with the solder pad.

In a further variation, the metal strips can be arranged according to a predetermined pattern to produce a unique ground pattern for solder pads on each mezzanine board.

In a variation on this aspect, the logic module is to assign a unique identifier for a processor on the respective mezzanine board based on the determined location.

In a further variation, the mezzanine boards are communicatively coupled to each other via cables, and a respective mezzanine board can include a transmitter to transmit the identifier of the processor on the respective mezzanine board to a downstream mezzanine board and a receiver to receive, from an upstream mezzanine board, an identifier of a processor on the upstream mezzanine board.

In a further variation, the respective mezzanine board is to send, to the motherboard, the identifier of the processor on the respective mezzanine board and the received identifier of the processor on the upstream mezzanine board, thereby facilitating a logic module on the motherboard to detect a connection topology of the mezzanine board.

In a further variation, the logic module on the motherboard is to determine whether the detected connection topology is invalid.

In a variation on this aspect, the solder pads are positioned adjacent to an edge of the respective mezzanine board, facing a front side of the metal enclosure.

One aspect of the instant application describes a method for detecting a topology of a plurality of interconnected and stacked circuit boards. The method can include determining, by a logic module on a respective circuit board, a location of the circuit board; assigning a unique identifier for the respective circuit board based on the determined location; transmitting information associated with the unique identifier to a downstream circuit board; receiving, from an upstream circuit board, information associated with an identifier of the upstream circuit board; and sending, to a logic module on a motherboard communicatively coupled to the plurality of circuit boards, information associated with the identifier of the respective circuit board and information associated with the identifier of the upstream circuit board, thereby facilitating a logic module on a motherboard to detect the topology of the interconnected and stacked circuit boards.

In a variation on this aspect, the circuit board can include a number of solder pads, and a respective solder pad can be grounded by a metal strip attached to a metal enclosure enclosing the circuit boards. Determining the location of the circuit board can include determining a ground pattern of the solder pads on the circuit boards.

In a further variation, the solder pads are electrically coupled to a number of predetermined pins on the logic module. Determining the ground pattern of the solder pads can include determining a voltage level of each pin.

In a variation on this aspect, the circuit boards are processor mezzanine boards included in a multi-processor server, and the method can further include assigning a unique socket number for each processor on the circuit board.

In a further variation, the information associated with the unique identifier comprises the unique socket number of each processor.

In a variation on this aspect, the method can further include determining, by the logic module on a motherboard, whether the detected topology is invalid.

In a further variation, determining whether the detected topology is invalid can include comparing the detected topology with a plurality of known valid topologies.

In a further variation, the method can further include, in response to determining that the detected topology is invalid, stopping a booting process and displaying an error message.

One aspect of the instant application describes a processor mezzanine board for a multi-processor server. The processor mezzanine board can include one or more processors, a number of solder pads, and a logic module to determine a location of the processor mezzanine board within a plurality of stacked processor mezzanine boards based on a contact pattern between a plurality of metal strips and the solder pads. The metal strips are attached to a metal enclosure enclosing the plurality of stacked processor mezzanine boards.

In a variation on this aspect, the solder pads are coupled to pins of the logic module, and a solder pad in contact with a corresponding metal strip is grounded, thereby allowing the logic module to determine the contact pattern based on a status of the pins.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A system, comprising:
a plurality of stacked mezzanine boards, each mezzanine board being communicatively coupled to a motherboard;
a metal enclosure enclosing the motherboard and mezzanine boards, wherein a respective mezzanine board comprises a number of solder pads, and wherein the metal enclosure comprises a plurality of metal strips, a respective metal strip to make an electrical contact with a solder pad of a corresponding mezzanine board to ground the solder pad; and
a logic module positioned on the respective mezzanine board to determine a stacking order of the respective mezzanine board among the stacked mezzanine boards based on a contact pattern between the metal strips and solder pads of the respective mezzanine board, the logic module to assign a unique board identifier to the respective mezzanine board based on the determined stacking order.

2. The system of claim 1, wherein the solder pads on the respective mezzanine board are electrically coupled to corresponding pins of the logic module.

3. The system of claim 1, wherein the metal enclosure is grounded, and wherein the plurality of metal strips are attached to a sidewall of the metal enclosure at different locations.

4. The system of claim 3, wherein the respective metal strip comprises an attachment base attached to the sidewall via a support bracket and an L-shaped contact-finger to be in contact with the solder pad.

5. The system of claim 3, wherein the plurality of metal strips are attached to the sidewall according to a predetermined pattern to produce a unique ground pattern for solder pads on each mezzanine board.

6. The system of claim 1, wherein the logic module is to compute a unique socket identifier for a processor on the respective mezzanine board based on the unique board identifier and a predetermined algorithm.

7. The system of claim 6, wherein the mezzanine boards are communicatively coupled to each other via cables, and wherein a respective mezzanine board comprises a transmitter to transmit the unique socket identifier of the processor on the respective mezzanine board to a downstream mezzanine board and a receiver to receive, from an upstream mezzanine board, a socket identifier of a processor on the upstream mezzanine board.

8. The system of claim 6, wherein the respective mezzanine board is to send, to the motherboard, the unique socket identifier of the processor on the respective mezzanine board and the received a socket identifier of a processor on the upstream mezzanine board, thereby facilitating a logic module on the motherboard to detect a connection topology of the mezzanine board.

9. The system of claim 8, wherein the logic module on the motherboard is to determine whether the detected connection topology is invalid.

10. The system of claim 1, wherein the solder pads are positioned adjacent to an edge of the respective mezzanine board, facing a front side of the metal enclosure.

11. A method for detecting a topology of a plurality of interconnected and stacked circuit boards, the method comprising:
determining, by a logic module on a respective circuit board, a stacking order of the circuit board among the plurality of circuit boards, each circuit board comprising a number of solder pads, a respective solder pad to be grounded by a metal strip attached to a metal enclosure enclosing the circuit boards, and determining the stack order comprising determining a ground pattern of the solder pads on the circuit board;
assigning a unique board identifier to the respective circuit board based on the determined stacking order;
transmitting information associated with the unique board identifier to a downstream circuit board;
receiving, from an upstream circuit board, information associated with a unique board identifier of the upstream circuit board; and
sending, to a logic module on a motherboard communicatively coupled to the plurality of circuit boards, information associated with the unique board identifier of the respective circuit board and information associated with the unique board identifier of the upstream circuit board, thereby facilitating the logic module on the motherboard to detect the topology of the interconnected and stacked circuit boards.

12. The method of claim 11, wherein the solder pads are electrically coupled to a number of predetermined pins on the logic module, and wherein determining the ground pattern of the solder pads comprises determining a voltage level of each pin.

13. The method of claim 11, wherein the plurality of circuit boards are processor mezzanine boards included in a multi-processor server, and wherein the method further comprises computing a unique socket number for each processor on the circuit board based on the unique board identifier and a predetermined algorithm.

14. The method of claim 13, wherein the information associated with the unique board identifier comprises the unique socket number of each processor.

15. The method of claim 11, further comprising determining, by the logic module on a motherboard, whether the detected topology is invalid.

16. The method of claim 15, wherein determining whether the detected topology is invalid comprises comparing the detected topology with a plurality of known valid topologies.

17. The method of claim 15, further comprising:
in response to determining that the detected topology is invalid, stopping a booting process and displaying an error message.

18. A processor mezzanine board for a multi-processor server, the processor mezzanine board comprising:
one or more processors;
a number of solder pads; and
a logic module to determine a stacking order of the processor mezzanine board among a plurality of stacked processor mezzanine boards based on a contact pattern between a plurality of metal strips and the solder pads, wherein the metal strips are attached to different locations on a sidewall of a metal enclosure enclosing the plurality of stacked processor mezzanine boards, and wherein the logic module is to assign a unique board identifier to the processor mezzanine board based on the determined stacking order.

19. The processor mezzanine board of claim 18, wherein the solder pads are coupled to pins of the logic module, wherein a solder pad in contact with a corresponding metal strip is grounded, thereby allowing the logic module to determine the contact pattern based on a status of the pins.

* * * * *